(12) United States Patent
Heard

(10) Patent No.: US 6,504,717 B1
(45) Date of Patent: Jan. 7, 2003

(54) FAILURE-TOLERANT HIGH-DENSITY CARD RACK COOLING SYSTEM AND METHOD

(75) Inventor: Christopher S. Heard, Brookline, NH (US)

(73) Assignee: Cereva Networks. Inc., Marlborough, MA (US)

(*) Notice: Subject to any disclaimer, the term of this patent is extended or adjusted under 35 U.S.C. 154(b) by 0 days.

(21) Appl. No.: 09/882,167

(22) Filed: Jun. 15, 2001

(51) Int. Cl.[7] ............................................... H05K 7/20
(52) U.S. Cl. .................. 361/695; 361/690; 361/694; 361/692; 174/16.1; 165/104.33; 165/122; 454/184
(58) Field of Search ..................... 361/687, 690–695, 361/697, 717–719; 174/15.1, 16.1; 165/80.3, 121–126; 454/184

(56) References Cited

U.S. PATENT DOCUMENTS

| | | | | |
|---|---|---|---|---|
| 5,210,680 A | * | 5/1993 | Schiebler | 361/695 |
| 5,544,012 A | * | 8/1996 | Koike | 361/695 |
| 5,562,410 A | * | 10/1996 | Sachs et al. | 415/213.1 |
| 5,949,646 A | * | 9/1999 | Lee et al. | 361/695 |
| 5,969,942 A | * | 10/1999 | Heckner et al. | 361/695 |
| 5,986,882 A | * | 11/1999 | Ekrot et al. | 361/687 |
| 6,115,250 A | * | 9/2000 | Schmitt | 361/695 |
| 6,135,875 A | * | 10/2000 | French | 454/184 |
| 6,222,729 B1 | * | 4/2001 | Yoshikawa | 361/695 |

* cited by examiner

*Primary Examiner*—Boris Chervinsky
(74) *Attorney, Agent, or Firm*—Kudirka & Jobse, LLP

(57) ABSTRACT

Impellers are used in the pull tray of a failure tolerant cooling system and are isolated from each other by baffles, so that each impeller has its own exhaust air flow path with an predetermined airflow resistance. The exhaust airflow resistance is sufficiently low that the associated impeller can exhaust enough air to provide sufficient airflow over the components during normal operation. In particular, the airflow is sufficient so that if a fan in the push tray fails, the pressure drop created by the impellers in the pull tray is sufficient to draw air through the space occupied by the failed fan. However, the exhaust airflow resistance for each impeller in the pull tray is sufficiently high that, if an impeller fails, the resistance limits the amount of air that the remaining impellers can pull in through the failed impeller opening, thereby enabling the airflow delivered by the fans in the push tray to continue to be distributed evenly across the components.

20 Claims, 2 Drawing Sheets

FAILURE-TOLERANT HIGH-DENSITY CARD RACK COOLING SYSTEM AND METHOD

FIELD OF THE INVENTION

This invention relates to airflow cooling systems for electrical and electronic equipment and to cooling systems for fault-tolerant apparatus.

BACKGROUND OF THE INVENTION

Modern electronic product packages typically have electronic components mounted on a set of printed circuit boards or other carriers that are arranged parallel to each other. In order to achieve design goals, the component density on the carriers has steadily increased. In addition, for purposes of electromagnetic shielding and mechanical isolation, the components are usually enclosed in a conductive metal box. Because the components are enclosed, a cooling system must be used to keep the components within an acceptable operating temperature range. Conventional cooling systems use multiple fans to generate a sufficiently high airflow across the components to insure that they do not overheat.

However, the high heat load generated by the high-density components combined with a demand for high system reliability and availability place severe demands on this cooling system. In particular, it is not currently acceptable to require an entire system to shut down if a single cooling fan fails because the system will be unavailable during the time it takes to replace the fan. Consequently, the prior art has developed cooling systems that attempt to continue operation of the system without overheating the components even after a fan has failed.

For example, one cooling system uses trays of axial fans located at opposite ends of the enclosed space. The fans are often used in a "push-pull" arrangement in which the "push" fans at one end draw air from the surrounding environment and exhaust the air into the enclosure while the "pull" fans at the other end of the system draw air out of the enclosure and exhaust the air into the surrounding environment. If sufficient numbers of fans are used, the airflow across the components will be high enough to prevent overheating even following the failure of a fan. This approach is generally successful, but does not work well in a system design where there is high airflow resistance over the components. For example, such a condition can occur when the distance between the printed circuit boards or component carriers is less than one inch.

The effect of this high resistance is that, when a fan fails, the airflow in that fan reverses, in turn, causing the air near a fan that has failed to recirculate around the fan. In particular, if a fan in the "push" tray fails, some of the air pushed into the enclosure by the remaining push fans exits through the failed fan rather than flowing over the components. Similarly, if a fan in the "pull" tray fails, air is drawn through the fan into the enclosure by the remaining pull fans. The result is that the electronic components are deprived of sufficient airflow and a thermal runaway condition is created with resultant component failure.

A conventional solution to the aforementioned problem is to use impellers with backwardly-curved blades in place of fans in the "pull" tray. The impellers create an air flow that is strong enough to draw air through an opening occupied by any fan that has failed in the "push" tray. However, when an impeller in the pull tray fails, the large hole it occupies makes it virtually impossible for the neighboring impellers to draw sufficient air through the component enclosure. Instead, the remaining impellers begin to draw air through the opening in the enclosure occupied by the failed impeller, resulting in airflow recirculation, this time in the pull tray, and again causing overheating.

Therefore, there is a need for a cooling system that can provide adequate airflow across component enclosures, including enclosures with high airflow resistance and that can tolerate the failure of a fan, or impeller, without overheating.

SUMMARY OF THE INVENTION

In accordance with one embodiment of the invention, impellers are used in the pull tray and are isolated from each other by baffles, so that each impeller its own exhaust air flow path. The exhaust path is provided with a predetermined airflow resistance. The exhaust airflow resistance is sufficiently low that the associated impeller can exhaust enough air to provide sufficient airflow over the components during normal operation. In particular, the airflow is sufficient so that if a fan in the push tray fails, the pressure drop created by the impellers in the pull tray is sufficient to draw air through the space occupied by the failed fan.

However, the exhaust airflow resistance for each impeller in the pull tray is sufficiently high that, if an impeller fails, the resistance limits the amount of air that the remaining impellers can pull in through the failed impeller opening, thereby enabling the airflow delivered by the fans in the push tray to continue to be distributed evenly across the components.

In one embodiment, the exhaust airflow resistance is created by using impellers with relatively small areas in the pull tray.

In another embodiment, the exhaust airflow resistance is created by placing a screen across the airflow exit to increase airflow resistance.

In still another embodiment, the exhaust airflow resistance is created by using a combination of impellers with relatively small areas and a screen across the airflow exit in order to increase airflow resistance.

BRIEF DESCRIPTION OF THE DRAWINGS

The above and further advantages of the invention may be better understood by referring to the following description in conjunction with the accompanying drawings in which.

DETAILED DESCRIPTION

Figure 1:
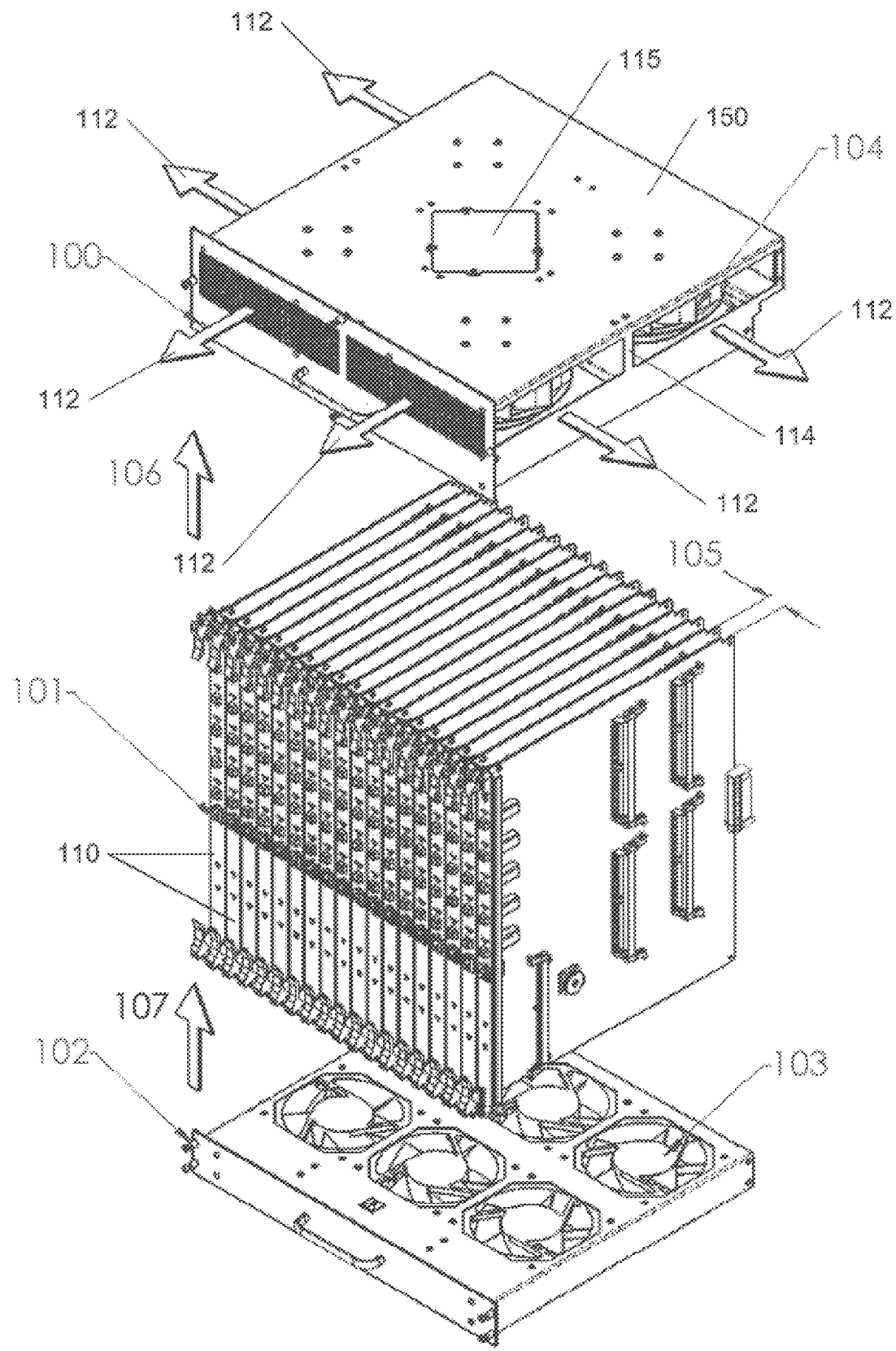
FIG. 1 is an exploded perspective diagram of a set of component carriers, a push tray and a pull tray, such as would be mounted inside an enclosure, but with the enclosure removed.

An embodiment of the inventive cooling system design is illustrated in FIG. 1 which is an exploded perspective diagram of a set of component carriers 101, a push tray 102 and a pull tray 100. For clarity, the metal enclosure that would ordinarily surround the component carriers and fan trays is not shown in FIG. 1. For purposes of illustration, the electronic components that are to be cooled are mounted on individual printed circuit boards 110. In one application, the components are mounted on at least seventeen and, preferably eighteen, printed circuit boards which are, in turn, mounted on 0.9 inch centers (105) on a component rack, thereby creating a high-resistance airflow path schematically illustrated by arrows 106 and 107 up through the rack. The printed circuit boards 110 each typically support up to five 168-pin dual in-line memory modules (DIMMs), further restricting airflow over paths 106, 107.

The inventive cooling system is implemented using two trays 100 and 102. The lower or push fan tray 102 includes a plurality of axial fans 103. For example, the tray may include six 5-inch square axial fans 103, each with an airflow rate specified at 150 cubic feet per minute (CFM) at zero pressure differential across the fan.

The upper or pull tray 100 is an impeller tray composed of four, 6.89"-diameter backwardly-curved impellers (104), each having an airflow rated at 300 CFM. The impellers 104 draw air through the circuit boards 110 and exhaust the air out the front and sides of the upper tray 100 as indicated schematically by arrows 112. The upper tray 100 has a set of baffles of which baffle 114 us shown that isolate each impeller and direct the airflow in the direction of arrows 112. The upper tray 100 also has an upper cover 150 with a removable access panel 115 that allows access to the electrical connection for the impellers.

Figure 2:
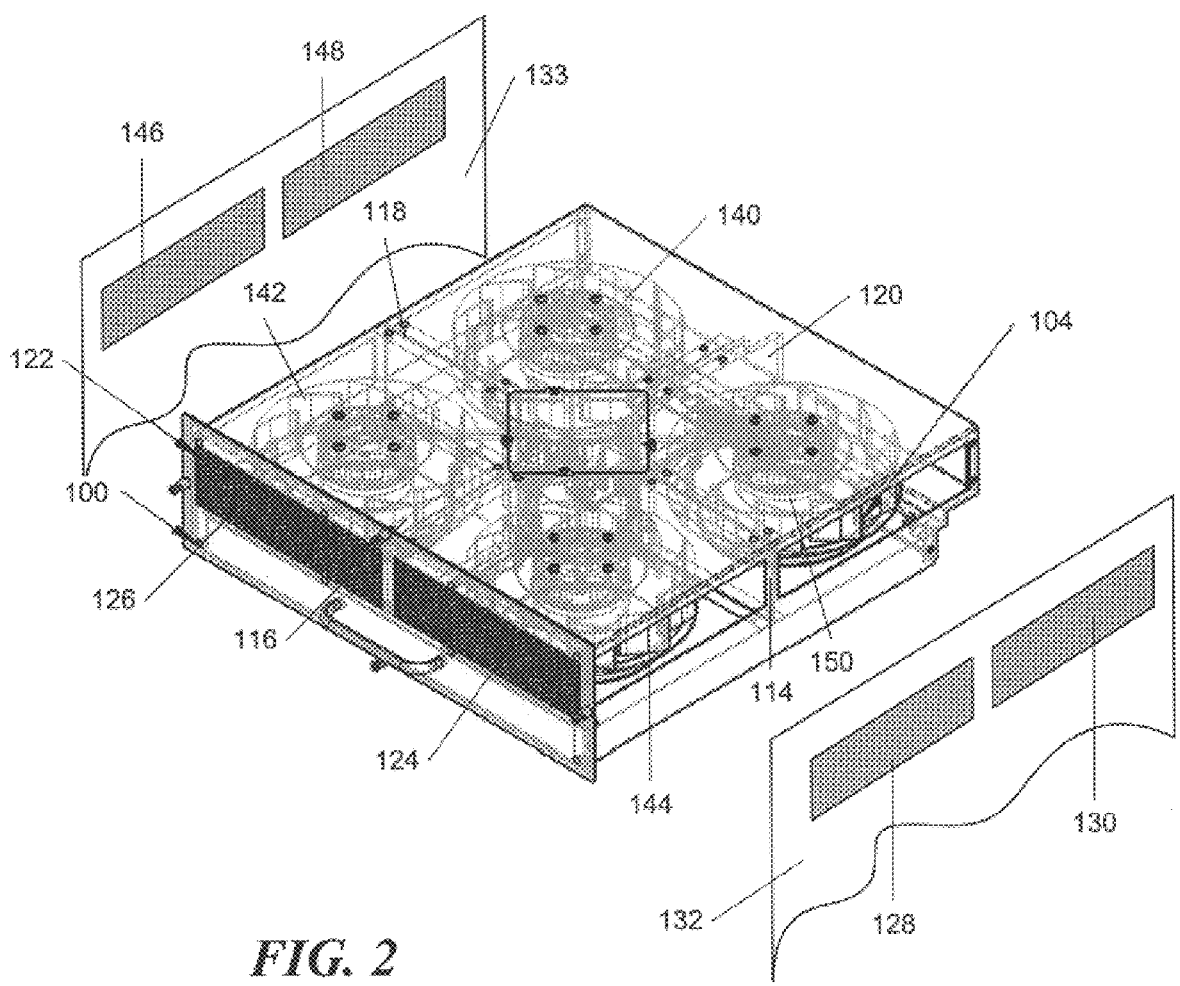
FIG. 2 is an enlarged perspective diagram of the inventive pull tray.

FIG. 2 shows the impeller tray 100 in greater detail and the impellers in phantom outline to illustrate the impeller arrangement. Also shown are portions 132, 133 of the enclosure into which the impeller tray 100 fits, illustrating vent openings 128, 130, 146 and 148. The four impellers 104, 140, 142 and 144 are separated and isolated by baffles 114, 116, 118 and 120 located between the impellers. The baffles force each impeller to exhaust through its associated vents. For example, impeller 144 exhausts through vents 124 and 128. Impeller 150 exhausts through vent 130. Impeller 142 exhausts through vent 124 and vent 146 in the sidewall 133 of the enclosure. Finally, impeller 140 exhausts through vent 148 in the sidewall 133 of the enclosure.

The exhaust vents 124, 126, 128, 130, 146 and 148 are covered with screens that have an open area of substantially 50%. In a preferred embodiment, the open area is 52% of the total screen area. This open area is adequate for air to escape when an impeller is running normally. If an axial fan in the lower tray 102 fails, the pressure drop across the printed circuit boards 110 created by the upper impeller tray 100 is sufficient to draw air through the space occupied by the failed fan providing for adequate airflow across the printed circuit boards.

If an impeller fails in the upper tray 100, the combination of the relatively small impeller opening and the restriction caused by the 52% open intake vent (formerly an exhaust vent when the impeller was running) represent a significant amount of airflow resistance. This resistance limits the amount of air that the remaining impellers can pull in through the failed impeller opening, thereby enabling the airflow delivered by the bottom fan tray 102 to continue to be distributed evenly across the printed circuit boards 110. The result is that the airflow is only slightly degraded and thermal performance is virtually unaffected.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, in some implementations, the shape and size of the vents may differ from that shown. Other aspects, such as the specific materials utilized to manufacture a particular element, as well as other modifications to the inventive concept are intended to be covered by the appended claims.

What is claimed is:

1. A failure-tolerant high-density electronic component cooling system for cooling electronic components in an enclosure with a first and second open end, the cooling system comprising:
    a push tray located at the first open end of the enclosure and having a plurality of fans for drawing ambient air into the enclosure and forcing the air over the electronic components in the enclosure;
    a pull tray located at the second open end of the enclosure and having a plurality of impellers with airflow openings for drawing air over the electronic components and exhausting air outside the enclosure, the pull tray having a plurality of baffles arranged between the impellers so that each impeller exhausts air directly out of the enclosure through a vent area dedicated to the each impeller; and
    a screen covering each vent area, the screen having an open area of substantially 50%, each impeller having an airflow opening with an airflow resistance which, when combined with the airflow resistance of a screen covering its dedicated vent area, limits air drawn into the enclosure through a dedicated vent area of a failed impeller and prevents the disruption of a uniform airflow over the electronic components.

2. The cooling system of claim 1 wherein the electronic components are mounted on printed circuit boards positioned parallel to each with a spacing between printed circuit cards of less than one inch.

3. The cooling system of claim 2 wherein more than sixteen printed circuit boards are located within the enclosure.

4. The cooling system of claim 1 wherein each screen has an open area of 52%.

5. The cooling system of claim 1 wherein the enclosure is positioned with the first and second open end located vertically above each other.

6. The cooling system of claim 5 wherein the pull tray is located vertically above the push tray.

7. The cooling system of claim 1 wherein the push tray comprises six fans.

8. The cooling system of claim 1 wherein the pull tray comprises four impellers.

9. The cooling system of claim 1 wherein each impeller has a diameter of 6.89 inches and a airflow capacity of 300 CFM.

10. The cooling system of claim 1 wherein each fan has an airflow capacity of 150 CFM.

11. A method for cooling electronic components in an enclosure with a first and second open end, the method comprising:
    (a) placing a push tray at the first open end of the enclosure, the push tray having a plurality of fans for drawing ambient air into the enclosure and forcing the air over the electronic components in the enclosure;
    (b) placing a pull tray located at the second open end of the enclosure, the pull tray having a plurality of impellers with airflow openings for drawing air over the electronic components and exhausting air outside the enclosure, the pull tray having a plurality of baffles arranged between the impellers so that each impeller exhausts air directly out of the enclosure through a vent area dedicated to the each impeller; and
    (c) covering each vent area with a screen having an open area of substantially 50%, each impeller having an airflow opening with an airflow resistance which, when combined with the airflow resistance of a screen covering its dedicated vent area, limits air drawn into the enclosure through a dedicated vent area of a failed impeller and prevents the disruption of a uniform airflow over the electronic components.

12. The method of claim 11 wherein the electronic components are mounted on printed circuit boards positioned parallel to each with a spacing between printed circuit cards of less than one inch.

13. The method of claim 12 wherein more than sixteen printed circuit boards are located within the enclosure.

14. The method of claim 11 wherein each screen has an open area of 52%.

15. The method of claim 11 wherein the enclosure is positioned with the first and second open end located vertically above each other.

16. The method of claim 15 wherein step (b) comprises locating the pull tray vertically above the push tray.

17. The method of claim 11 wherein the push tray comprises six fans.

18. The method of claim 11 wherein the pull tray comprises four impellers.

19. The method of claim 11 wherein each impeller has a diameter of 6.89 inches and a airflow capacity of 300 CFM.

20. The method of claim 11 wherein each fan has an airflow capacity of 150 CFM.

* * * * *